United States Patent
Hartzell

(10) Patent No.: US 7,135,070 B2
(45) Date of Patent: *Nov. 14, 2006

(54) MONOLITHIC STACKED/LAYERED CRYSTAL-STRUCTURE-PROCESSED MECHANICAL, AND COMBINED MECHANICAL AND ELECTRICAL, DEVICES AND METHODS AND SYSTEMS FOR MAKING

(75) Inventor: John W. Hartzell, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 447 days.

This patent is subject to a terminal disclaimer.

(21) Appl. No.: 10/131,808

(22) Filed: Apr. 23, 2002

(65) Prior Publication Data
US 2003/0196592 A1 Oct. 23, 2003

(51) Int. Cl.
*C30B 19/10* (2006.01)
(52) U.S. Cl. .............. 117/43; 117/44; 117/45; 117/953; 117/3; 117/4; 117/47; 117/46
(58) Field of Classification Search .............. 117/2, 117/3, 4, 37, 904, 47, 46, 50, 7, 43, 44, 45, 117/953
See application file for complete search history.

(56) References Cited

U.S. PATENT DOCUMENTS

| | | | | | |
|---|---|---|---|---|---|
| 4,662,949 | A | * | 5/1987 | Inoue et al. | 148/1.5 |
| 5,382,537 | A | * | 1/1995 | Noguchi | 437/41 |
| 5,741,359 | A | * | 4/1998 | Motoda et al. | 117/43 |
| 5,803,965 | A | * | 9/1998 | Yoon | 117/4 |
| 5,932,003 | A | * | 8/1999 | Naomoto et al. | 117/4 |
| 5,985,704 | A | * | 11/1999 | Adachi et al. | 438/166 |
| 6,016,686 | A | | 1/2000 | Thundat | 73/23.2 |
| 6,080,236 | A | * | 6/2000 | McCulloch et al. | 117/4 |
| 6,113,689 | A | * | 9/2000 | Moon | 117/43 |
| 6,143,661 | A | * | 11/2000 | Kousai et al. | 438/689 |
| 6,171,890 | B1 | * | 1/2001 | Adachi et al. | 438/162 |
| 6,176,922 | B1 | * | 1/2001 | Aklufi et al. | 117/4 |
| 6,193,796 | B1 | * | 2/2001 | Yang | 117/4 |
| 6,241,817 | B1 | * | 6/2001 | Jang et al. | 117/8 |
| 6,300,619 | B1 | * | 10/2001 | Aksyuk et al. | 250/216 |
| 6,303,885 | B1 | * | 10/2001 | Hichwa et al. | 200/181 |
| 6,305,788 | B1 | * | 10/2001 | Silverbrook | 347/54 |
| 6,307,815 | B1 | * | 10/2001 | Polosky et al. | 368/220 |
| 6,322,625 | B1 | | 11/2001 | Im | 117/43 |
| 6,375,737 | B1 | * | 4/2002 | Shih et al. | 117/3 |

(Continued)

FOREIGN PATENT DOCUMENTS

WO      WO 97/45827      * 12/1997

(Continued)

OTHER PUBLICATIONS

Article entitled, "Origin of Nanomechanical Cantilever Motion Generated from Biomolecular Interactions", by Wu et al., published in PNAS, Feb. 13, 2001, vol. 98, No. 4, pp. 1560-1564.

(Continued)

*Primary Examiner*—Yogendra N. Gupta
*Assistant Examiner*—Matthew J Song
(74) *Attorney, Agent, or Firm*—David C. Ripma

(57) ABSTRACT

Monolithic stacked/layered room-temperature-processed materials whose internal crystalline structures are laser modification to create arrays of mechanical, and combined mechanical and electrical, devices with precision-established properties, such as important mechanical properties. Methodology and system configurations are disclosed.

2 Claims, 3 Drawing Sheets

U.S. PATENT DOCUMENTS

| | | | |
|---|---|---|---|
| 6,558,802 B1 * | 5/2003 | Henley et al. | 428/446 |
| 6,860,939 B1 * | 3/2005 | Hartzell | 117/43 |
| 2002/0017233 A1 * | 2/2002 | Adachi et al. | 117/4 |
| 2003/0000455 A1 * | 1/2003 | Voutsas | 117/47 |

FOREIGN PATENT DOCUMENTS

| | | |
|---|---|---|
| WO | WO 01/18854 A1 | 3/2001 |
| WO | WO 01/18855 A1 | 3/2001 |
| WO | WO 01/71791 A1 | 9/2001 |

OTHER PUBLICATIONS

Article entitled, "Analysis of Amplification of Thermal Vibrations of a Microcantilever" by Muralidharan et al., published in Journal of Applied Physics, vol. 89, No. 8, Apr. 15, 2001, pp. 45874591.

Article entitled, "Cantilever-Based Optical Deflection Assay for Discrimination of DNA Single-Nucleotide Mismatches", by Hansen et al., published in Analytical Chemistry, Vo. 73, No. 7, Apr. 1, 2001, pp. 1567-1571.

Article entitled, "Manipulation and controlled Amplification of Brownian Motion of Microcantilever Sensors", by Mehta et al., published in Applied Physics Letters, vol. 78, No. 11, Mar. 12, 2001, pp. 1637-1639.

Article entitled, "Measuring Magnetic Susceptibilities of Nanogram Quantities of Materials Using Microcantilevers", by Finot et al., published in Ultramicroscopy 86 (2001), pp. 175-180.

Paper entitled, "Sustaining Self-Driven Oscillations in Microcantilevers—Criteria Obtained Using the Beam Equation", by Passian et al., dated Oct. 5, 2001, pp. 1-35.

Article entitled, "In SITU Detection of Calcium Ions with Chemically Modified Microcantilevers", by Ji et al., published in Biosensors & Bioelectronics 000 (2001) 000-000, pp. 1-7.

Article entitled, "Detection of pH Variation Using Modified Microcantilever Sensors" by Ji et al., published in Sensors & Actuators B 3641 (2001) pp. 1-6.

Paper entitled, "MEMS Sensors and Wireless Telemetry for High-Sensitivity Chemical and Biological Sensing", by Britton et al., consisting of 12 pages.

Article entitled, "Investigation of Adsorption and absorption-induced stresses using Microcantilever Sensors" by Hu et al. published in Journal of Applied Physics, Jul. 15, 2001, vol. 90, No. 2, pp. 1-5.

Article entitled, "Chemical Sensing in Fourier Space", by Thundat et al., published in Applied Physics Letters, vol. 77, No. 25, Dec. 18, 2000, pp. 1-3.

Article entitled, "Bioassay of Prostate-Specific Antigen (PSA) Using Microcantilevers", by Wu et al., published in Nature Biotechnology, Vo. 19, Sep. 2001, pp. 856-860.

Article entitled, "New MEMS Technology Using Multi-Layer NILC Poly-Si and NiSi Films", by Cheung et al., published in Mat. Res. Soc. Symp. Proc. vol. 687, pp. B5-24.1-B5.24.6.

* cited by examiner

56

58

MONOLITHIC STACKED/LAYERED CRYSTAL-STRUCTURE-PROCESSED MECHANICAL, AND COMBINED MECHANICAL AND ELECTRICAL, DEVICES AND METHODS AND SYSTEMS FOR MAKING

BACKGROUND AND SUMMARY OF THE INVENTION

The present invention arises from a new area of recognition and development focussed on the technology of low-temperature, crystalline-structure-processed devices, and in particular mechanical, mechanical and electrical, so-called MEMS (micro-electromechanical), layered and stacked devices, and devices organized into monolithic arrays in layers, that opens up a broad new field of potential devices and applications not heretofore so inexpensively and conveniently made practical and practicable. This new field of possible devices, from which a number of inventions, one of which is specifically addressed in this disclosure, springs effectively from the recognition that internal crystalline-structure processing performed within the bodies of a wide variety of different materials, is capable of enabling fabrication of small (perhaps even down to devices formed from small molecular clusters), versatile, widely controllable and producible, accurate, mechanical, electromechanical and MEMS devices that can be formed very inexpensively, and, with respect to laser processing, in uncontrolled and room-temperature environments not requiring vacuum chambers, etc.

Especially, the invention offers significant opportunities for the building, relatively cheaply and very reliable, of very tiny mechanical devices that can be deployed in dense two-dimensional and three-dimensional complex arrays and stacked arrangements. These devices can take on a large range of different configurations, such as individuated, single-device configurations, monolithic single-layer array arrangements of like devices, similar monolithic arrays of combined electrical and mechanical devices, and in vertically integrated and assembled stacks and layers of complex devices, simply not achievable through conventional prior art processes and techniques. By enabling room-temperature fabrication, otherwise easily damaged and destroyed layer-supporting substrates, including fabricated-device underlayers, can readily be employed.

The field of discovery and recognition which underpins the invention disclosed herein, can be practiced with a very wide range of materials, such as non-semiconductor and semiconductor materials, piezoelectric materials, dielectric materials, in arrays that can be deployed on rigid substrates of various characters, and on a wide range of flexible materials, such as traditional flex-circuit materials (polymers and plastics), metallic foil materials and even fabric materials. Additionally, the field of development from which the present invention emerges can be employed with large-dimension bulk materials, as well as with various thin-film materials. With regard to the latter category of materials, the process of this invention can take advantage of traditional thin-film processing techniques to shape and organize unique devices, which are otherwise prepared in accordance with the internal crystalline-structure-processing proposed by the present invention, thus to achieve and offer mechanical properties in a broad arena of new opportunities.

The invention can be summarized as one regarding system implementation of a method utilizing room-temperature internal crystal-structure processing of a selected material to create layered stacks of monolithic arrays of both interactive and non-interactive mechanical, and combined mechanical and electrical, devices with the mechanical devices in an array having both the three-dimensional configurations, and the required internal mechanical properties, for performing a chosen task. The invention is ideal for producing various complex MEMS devices and for creating stacked arrangements of inter-relateable devices.

From the drawings and the descriptions which now follow, it will become readily apparent how the present invention lends itself to the economic, versatile, multi-material fabrication and use of a large variety of devices, ranging from relatively large devices to extremely small devices (as mentioned earlier), and including various forms of MEMS devices, without the fabrication of these devices, insofar as laser processing is involved, necessitating the use of special controlled processing environments, or surrounding processing temperatures above typical room temperature.

In the context of this invention's applicability in many different settings, its description herein follows a preliminary foundation description regarding the creation of individual devices formed of many different materials, including relatively thin bulk materials, as well as isolated formation of monolithic arrays of devices produced in accordance with the invention. Those skilled in the art will recognize how these foundation descriptors enhance an understanding of the specifically focussed-upon invention embodiments.

With this in mind, the significant improvements and special contributions made to the art of device-fabrication according to the invention will become more fully apparent as the invention description which now follows is read in conjunction with the accompanying drawings.

DESCRIPTION OF THE DRAWINGS

FIG. 7, in particular, illustrates a condition where material that is being processed in accordance with the invention is resting on a substrate which is not transparent to the wash of illumination coming from the bottom side of FIG. 7.

In FIGS. 2, 3, 4, 5, 6, 7, 8, 12 and 13, the darkened regions in the material being processed represents the processed regions in these materials.

DETAILED DESCRIPTION OF THE INVENTION

Figure 1:
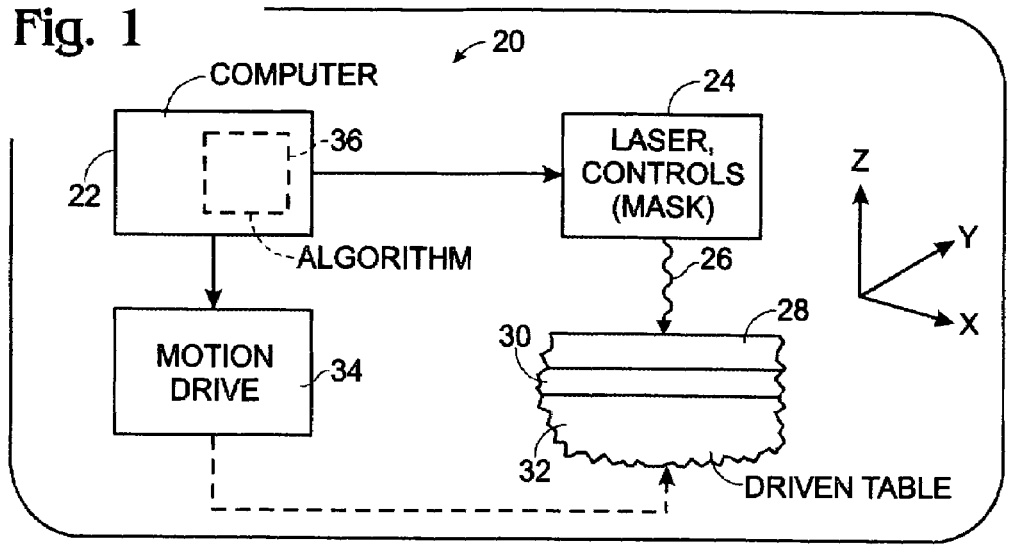
FIG. 1 is a block/schematic view illustrating a system which implements the methodology of this invention for the creation of single or arrayed mechanical devices in accordance with the present invention.

Turning now to the drawings, and referring first of all to FIG. 1, illustrated generally at 20 is a system which is employed according to the present invention to implement a methodology for processing the internal crystalline structure of various different materials in accordance with the invention, and all for the purpose of creating one or more mechanical devices that are intended to perform respective, predetermined, pre-chosen tasks. Included in system 20 are a block 22 which represents a suitably programmed digital computer, a block 24 which is operatively connected to block 22, and which represents the presence of appropriate laser structure and controls, such as beam-shaping and optics controls using optical or masking methods, fluency controls, angularity controls, masking controls, and other, for defining the functional characteristics of a appropriate laser beam shown at 26 which is to be employed in accordance with the invention to produce internal crystalline-structure processing of any one of a number of different materials, as will be more fully mentioned below. In FIG. 1, a material for processing is shown generally at 28, with this material having a layer form, and being suitably supported on an appropriate supporting substrate 30 which rests upon, and is anchored to, a three-axis translation table (a driven table) 32.

Table 32 is drivingly connected to a motion drive system, represented by block 34 in FIG. 1, which drive system is under the control of computer 22. This motion drive system, under the control and influence of computer 22, is capable of translating table 32, and thus material supported on this table, in each of the three usual orthogonal axes known as the X, Y, and Z axes, such axes being pictured at the right side of FIG. 1. Very specifically, control over motion of table 32 is directed by an appropriate algorithm 36 which is resident within computer 22, and which, fundamentally, is equipped to direct a laser beam for processing in accordance with device configuration and device internal mechanical properties that have been chosen and selected, and for which algorithm 36 is especially designed.

The exact nature of the construction of computer 22, of controls 24, of algorithm 36, and of the driven table and the motion drive therefor, form no part of the present invention, and accordingly are not further detailed herein.

Fundamentally, what takes place in the operation of system 20 to produce a given type of mechanical device is that a user selects a particular kind of device to build, selects an appropriate size and configuration for that device, and then determines what are the best and most appropriate internal mechanical properties that should be created in that device in order to enable it to function properly with respect to implementing a selected task. In general terms, the materials out of which a particular material can be selected to produce such a device are those respective, whose internal crystalline structures are closely linked to the material's mechanical properties. Specifically, the various useable materials are those whose internal crystalline structures can be modified by laser processing to produce desired mechanical properties for a device. Various materials with respect to which the present invention can conveniently and very successfully work will be discussed very shortly, but it might be noted at this point that these materials, with respect to their precursor states, i.e. their states before processing, range from fully amorphous materials through and into a range of various categories of polycrystalline materials.

For example, practice of the invention can begin with precursor material which can fit into any one of the following categories: amorphous, nanocrystalline, micro-crystalline, polycrystalline, and bulk. All such materials can be generally described as having an internal crystalline structure which, initially in a precursor state, is less than single crystalline in nature.

Materials which can very successfully be processed in accordance with this invention include silicon, germanium, silicon-germanium, various dielectric materials, various piezoelectric materials, copper, aluminum, and titanium to name a few. For the purpose of further illustration in this description, a manner of practicing the invention, and a device emerging from that practice, will be described in conjunction with full-layer-depth processing of a precursor amorphous silicon material, which will thus be treated as the specific kind of material which is pictured at 28 in FIG. 1. Also for the purpose of focused illustration herein, this precursor illustrative amorphous silicon material is deployed as an appropriate layer on a glass substrate, which is designated by reference number 30 in FIG. 1. Other substrate materials, as will become apparent, may include quartz, various metals, plastics, flex materials, fabrics and others. All of these materials have what are referred herein as relatively low melting (or destruction) temperatures which are well below the melting temperature of the silicon precursor material.

As has already been suggested above, practice of the present invention can produce a wide variety of uniquely configured and constructed mechanical devices which can be extremely small in size, ranging down even to a small molecular cluster size. Devices which can be produced include various MEMS devices, micro-mechanical devices that are sensitized to act as sensors for various environmental events, such as chemical and biological events, various motion elements generally, oscillating elements, cantilever beams, actuators, relay switches, and other devices.

With respect to formation of a particular device's three-dimensional configuration, this can be done in any one of a number of conventionally known ways. The exact processes employed to give three-dimensional definition to a finally produced device, as for example to singulate an element from a mass of material in which it has been formed, and/or to individuate (for performance purposes) plural devices in a monolithic array of devices, can take the form of various conventional processes which form no particular parts of the present invention. Thus they are not discussed herein in detail.

For the purpose of illustration herein, processing will be described in the setting, initially, of creating a single micro-mechanical cantilever mechanical device, using single-side, translated laser-beam processing. While various specific types of lasers can be employed, such as an excimer laser, a solid-state laser, a continuous-wave laser, and a femto laser, to name several, description will proceed in the context of using an excimer laser.

Describing now a typical practice implemented by the present invention, an amorphous silicon layer having a precursor thickness lying, for example, in the range of about 0.05 microns to perhaps above 1.0 microns is suitably formed on or attached to the surface in a glass substrate, such as substrate 30. This assembly is placed on table 32 with appropriate initial alignment, and is then translated relatively with respect to a laser beam, such as excimer laser beam 26, which beam is pulsed during translation of the material relative to the source of the laser beam, to produce full-depth, small-area quick melting and re-crystallizing of the silicon material. An appropriate excimer laser, driven and pulsed at an appropriate pulse rate, and with an appropriate fluency and footprint in the sense of how and with what outlines it strikes the surface of the amorphous silicon material, is directed toward this surface under the control of computer 22, algorithm 36, and controls 24.

In accordance with the desired end-result internal crystalline structure, and in a relative motion sense, the impingement point of this beam from a laser is moved in a defined way over the surface of the amorphous silicon material to produce rapid, full-depth melting and re-crystallizing in a manner designed to achieve the pre-determined desired internal crystalline structure. Employing an excimer laser in this fashion allows one to process material in such a fashion that the high-temperature events are essentially confined very locally to the regions specifically where material melt is occurring. Very little, and no dangerous, temperature rise occurs in the surrounding area, such as within substrate 30, and the whole process can take place in a normal atmospheric environment and completely at room temperature.

Figure 2:
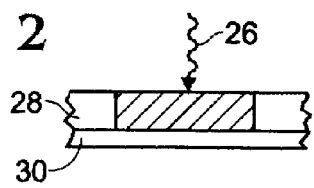
FIG. 2 is a schematic diagram illustrating single-side, full-depth internal-crystalline-structure laser processing to create a mechanical device in accordance with the invention.
Figure 3:
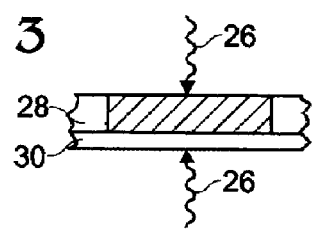
FIG. 3 is very similar to FIG. 2, except that here what is shown is two-sided processing according to the invention.
Figure 4:
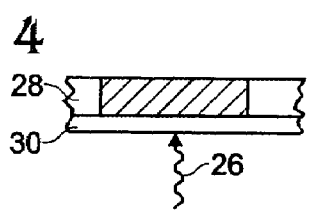
FIG. 4 is a view similar to FIG. 2, but here showing processing occurring from an opposite side of material in accordance with the invention.

FIGS. 2, 3 and 4 show several different approaches to implement such laser processing. In FIG. 2 the laser beam strikes the surface of the amorphous silicon material on the upper side which is spaced away from supporting substrate 30. Processed material is indicated (darkened) at 27. In FIG. 3 dual-sided processing takes place with two laser beams cooperating on opposite sides of the material, with the lower beam effectively processing the underside of the silicon material through the transparency afforded by glass substrate 30. Such dual-sided laser processing effectively allows melting and re-crystallizing to take place simultaneously on opposite sides of the supported silicon material, and with each laser, therefore, requiring only a portion of the power required for similar processing to take place under the influence of a single laser beam. Where a mask is employed for beam shaping, this dual-layer approach promotes longer-term durability of such a mask—a typically expensive device which is subject to significant degradation at high laser power levels.

In FIG. 4 single-side processing is demonstrated where, in this case, the processing laser beam is directed toward the silicon material from the bottom side (i.e. the substrate supported side) of this material.

Figure 5:
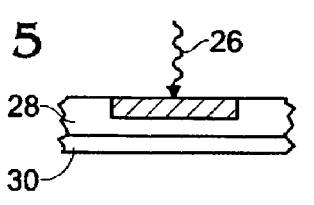
FIG. 5 is a view illustrating single-side, partial-depth internal-crystalline-structure processing according to the invention.

FIG. 5 illustrates single-side, less than full-depth processing of the silicon material, here employed to create ultimately a mechanical device which effectively becomes a device that is composited with unprocessed material lying beneath it, as illustrated in FIG. 5.

Figure 6:
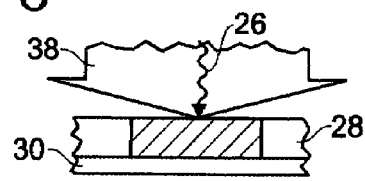
FIG. 6 is similar to FIG. 2, except that here single-side processing includes a flood, or wash, of general heating illumination according to one form of practicing the invention, with this illumination striking material on what is shown as the upper side in FIG. 6.
Figure 7:
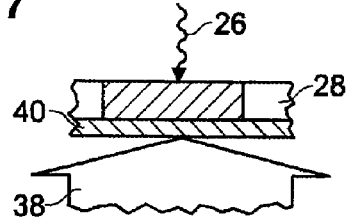
FIG. 7 is similar to FIG. 6, except that it illustrates two-sided processing wherein a relatively translated laser beam processes the upper side of material as pictured in FIG. 7, and a wash, or flood, of other illumination (from a laser or another light source) aids from the bottom side of material as pictured in FIG. 7.
Figure 8:
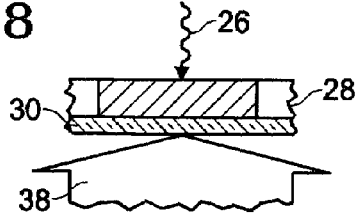
FIG. 8 is similar to FIG. 7, except that here the material being processed is resting on a substrate, such as glass, which is essentially transparent to a wash of illumination striking from the bottom side of FIG. 8.

FIGS. 6, 7 and 8 show different manners of modifying the kinds of laser processing illustrated in FIGS. 2–4 inclusive, and specifically a modified processing approach which employs an additional broad area wash of illumination 38 from another illumination source which could be, but is not necessarily, a laser source. In FIG. 6 this wash of illumination strikes the upper side of the silicon material in companionship with laser beam 26, and is effective essentially to create an overall temperature rise in the silicon material which permits a lower energy laser beam to perform appropriate full-depth processing. In FIGS. 7 and 8 this wash 38 of illumination is directed toward the underside of the silicon material and the supporting substrate, with FIG. 7 illustrating a condition where the substrate support material, shown at 40, is not transparent to illumination. In this implementation of the invention, the silicon material which is being processed is heated in a conduction manner through heating of substrate 40. In FIG. 8, glass substrate 30 is again pictured, and here, the wash 38 of illumination passes through this substrate to heat the silicon material above the substrate directly.

According to practice of the invention, once a particular mechanical device to build has been decided upon, the desired three dimensional configuration of this device is chosen, and algorithm 36 is designed to direct laser processing in such a fashion as to create a regional volume of material within the processed material on the substrate adequate for the ultimate individuation and singulation, if that is what is desired, of an end-result mechanical device. With such a chosen device configuration in mind, the most desired internal mechanical properties are predetermined, and algorithm 36 is also constructed so that it will control the operation of a laser beam, such as beam 26, to produce internal melting and re-crystallization in order to achieve an internal crystalline structure that will yield the desired mechanical properties. In some instances, it may be more appropriate to create differentiated regions of crystalline structure within a device being built in order to produce different specific mechanical properties in different locations within that material. Such is entirely possible utilizing the processing approach which has just been outlined above.

Figure 9:
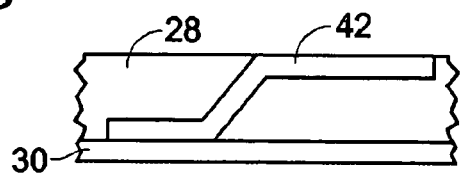
FIGS. 9 and 10 illustrate two different views of a stylized micro-cantilever beam structure (mechanical device) constructed in accordance with the invention.
Figure 10:
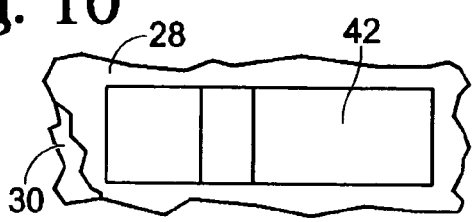

FIGS. 9 and 10 show a side cross section and an idealized top plan view of a stylized cantilever-beam mechanical device 42 which has been so defined by processing within the body of silicon material 28.

Figure 11:
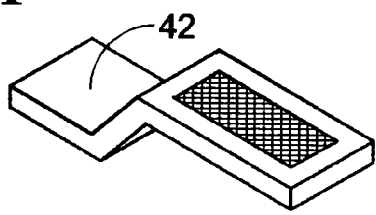
FIG. 11 shows an isolated view of a single micro-cantilever mechanical beam structure with a darkened region presented in this figure to illustrate, variously, sensitizing of a surface of the beam for the detection of a mechanical event, a chemical event, a biological event, etc. and also generally suggesting how, nested within the mechanical material making up the cantilever beam of FIG. 11 an electronic structure, such as a transistor, could be formed in a portion of the cantilever beam.

FIG. 11, in an idealized fashion, isolates an illustration of cantilever beam 42, and shows by way of suggestion, produced by the darkened patch which appears in FIG. 11, how an appropriate event sensor, such as a chemical sensor, a biological sensor, and other kinds of sensors could be applied, in any suitable manner, to the beam so as to respond to selected environmental events in a manner which causes deflection in the beam. The present invention is not concerned with the specific kinds of sensitivity for which a device, such as beam 42, is to be prepared, and thus details of how sensitizing can take place are not presented herein.

FIG. 11 can also be read to illustrate yet another interesting component offering of the present invention which is that it is possible to create within the mechanical body of the device, such as cantilever beam 42, an electronic device, such as a semiconductor transistor which can be thought of as being represented by the darkened patch appearing in FIG. 11.

Figure 12:
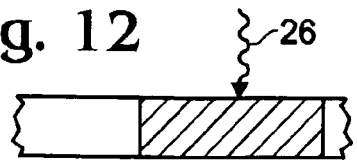
FIG. 12 is a view illustrating single-side, full-depth internal crystalline-structure processing of bulk material in accordance with the present invention.
Figure 13:
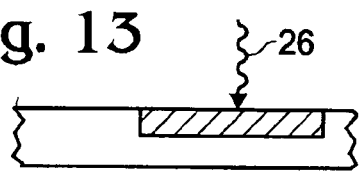
FIG. 13 is similar to FIG. 12, except that here what is shown is single-side, partial depth, bulk-material processing.

FIGS. 12 and 13 illustrate use of the invention to modify internal crystalline structure inside a bulk material 43, either with a full-depth approach (FIG. 12) or with a partial-depth approach (FIG. 13) in accordance with the invention.

Figure 14:
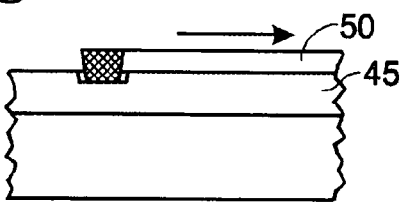
FIG. 14 is a view illustrating internal-crystalline-structure processing employing a single-crystal seed which is employed to characterize the end-result internal crystalline structure that can be achieved in the material pictured in FIG. 14.

FIG. 14 illustrates still another processing approach which utilizes a single-crystalline material seed 44 which rests in a tiny indentation formed in a appropriate layer 45 of a supporting material, such as a silicon dioxide. Seed 44 lies adjacent an amorphous layer 50 of silicon. Laser processing takes place with initial illumination of the seed, followed by laser-beam progression from the seed in a defined pattern over the amorphous silicon material. This action causes the single crystalline character of the seed 44 to become telegraphed into the internal structure of silicon layer 50, thus to characterize the internal crystalline structure in this layer to make it more nearly single crystalline in structure at the conclusion of processing.

Figure 15:
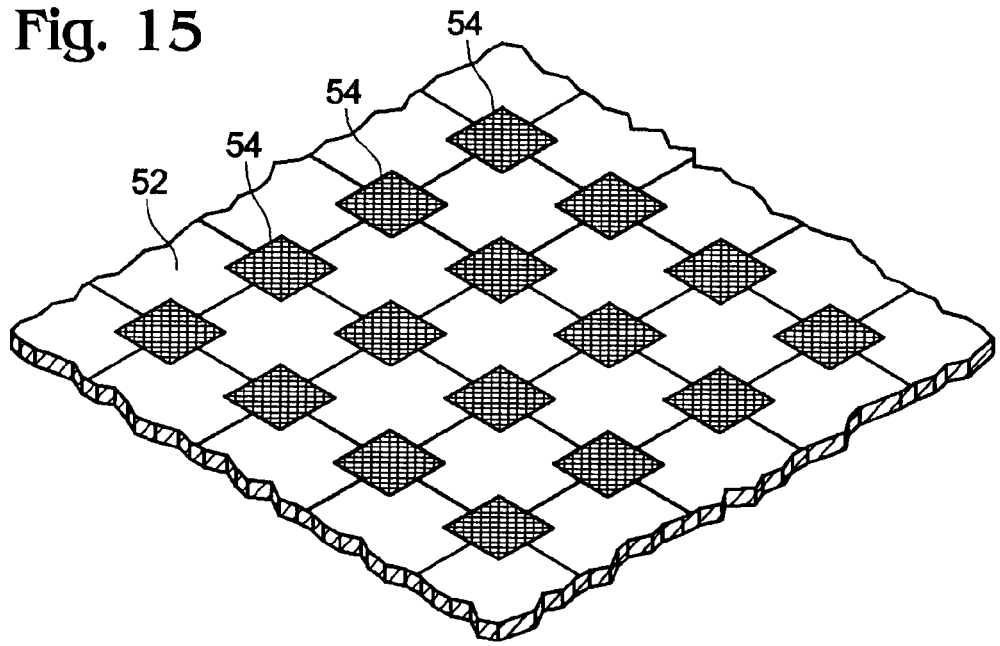
FIG. 15 is a stylized, schematic, isometric view illustrating fragmentarily a single planer array of plural mechanical devices prepared in a single monolithic, generally planar structure in accordance with the present invention.

FIG. 15 illustrates, in simplified fragmentary form, a monolithic layer structure 52 of processed, initially amorphous material which as been processed in an array fashion, and at discrete locations, to create a monolithic array of mechanical devices (darkened rectangles) such as the devices shown at 54. While it is certainly possible that each and every one of devices 54 is essentially the same in construction, and intended to perform the same kind of function, it is entirely possible, according to practice of the invention, to differentiate the functionalities and thus the structures of these arrayed elements.

Figure 16:
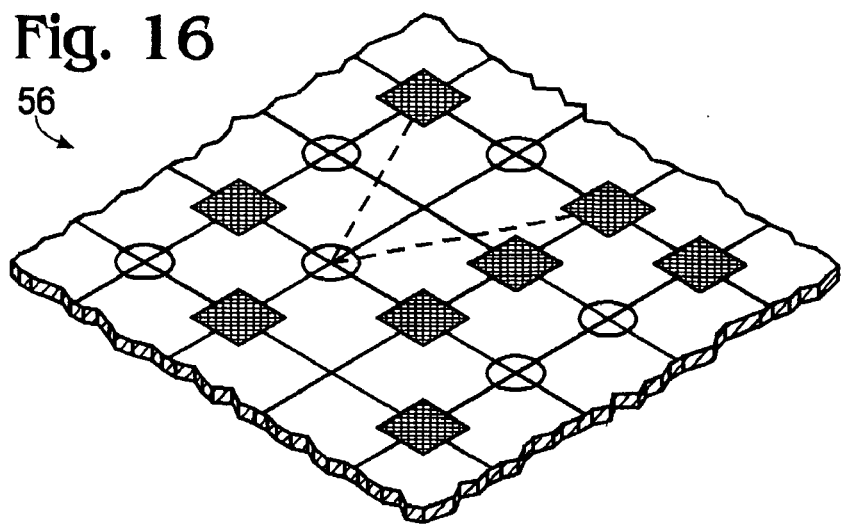
FIG. 16 presents a fragmented isometric view of a monolithic, single-layer array of both mechanical and electrical devices created in accordance with the present invention.

FIG. 16 shows fragmentarily at 56 a single-layer monolithic array with a combination of electrical and mechanical devices fabricated in accordance with the present invention. In this array, as was true with respect with the array pictured in FIG. 15, the darkened rectangles represent various mechanical devices produced in accordance with the invention. The open circles represent semiconductor devices, such as transistors which are made present in the array pictured in FIG. 16.

The practice of the present invention uniquely allows such a monolithic integration of combined mechanical and electrical, and of course electromechanical devices, built in accordance with the internal crystalline-structure-processing proposed by the present invention. Those devices pictured in the array of FIG. 16 which are not shown connected to any other device by a dashed line, while certainly connected in some fashion to other componentry, are, within the specific single array pictured in FIG. 16, non-interactive with one another. Those several devices (two mechanical devices, and on semiconductor device) shown interconnected by dashed lines are interactively interconnected.

Figure 17:
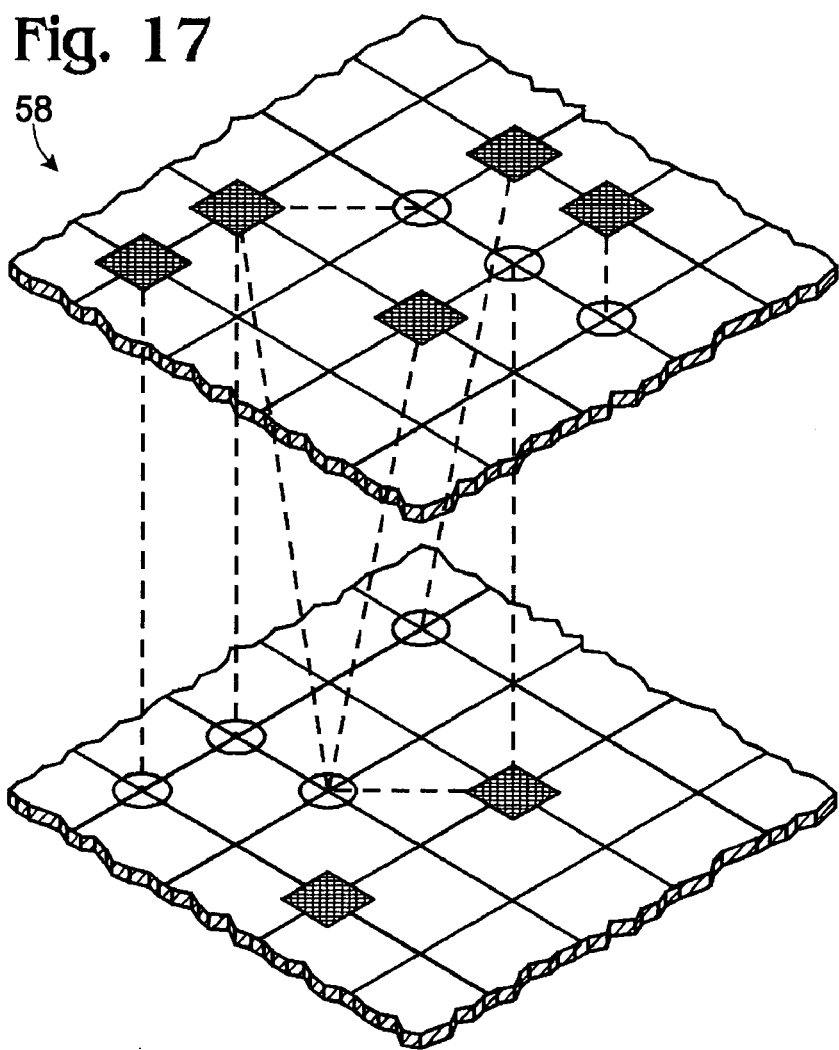
FIG. 17 is a fragmentary isometric view of portions of two monolithic arrays of combined mechanical and electrical devices constructed and stacked in accordance with the invention.

Turning attention now to FIG. 17, here there are indicated generally at 58 two stacked/layered adjacent monolithic layers of combined mechanical and electrical devices constructed in accordance with the present invention. The fragment of the upper monolithic layer pictured in FIG. 17 is seen to include five illustrative mechanical devices (the darkened rectangles) and three semiconductor transistors (the open circles). The lower fragmentary monolithic layer as pictured in FIG. 17 is seen to include two mechanical devices, and four semiconductor transistor devices, fabricated in accordance with practice of the present invention.

One can see within the structure illustrated in FIG. 17, in each of the two fragmentary layers shown, an interactive connection exists in each of these respective layers between one of the pictured mechanical devices and one of the pictured semiconductor transistors. Additionally, generally vertically or near vertically extending dashed lines in FIG. 17 represent interactive interconnections which exist between electrical and mechanical devices between the two monolithic layers. Such connections and interconnections can be formed in any suitable manner.

Inasmuch as practice of the present invention allows for substantially unlimited vertical stacking and layering of complex and sophisticated multi-device arrays, it will be very clear that the present invention enables the creation and use of very complex yet very easily and inexpensively manufactured monolithic arrays of large numbers of devices that can easily be interconnected to form an extremely compact mechanical, electrical and electromechanical (MEMS) arrangements not made possible heretofore by practice utilizing prior art structures, methods and systems.

In the context of fabricating a monolithic array of devices, an array which includes, in a continuous, single layer of material, both mechanical and electrical devices, the present invention provides a strikingly innovative fabrication approach. Very specifically, practice of this invention enables essentially the same substantially simultaneous fabrication process to perform a seamless, progressive, appropriately regionally differentiated formation of these two functionally different kinds of devices. Not only that, it also readily enables "generically" like devices (mechanical and electrical) to be specifically differentiated functionally one from another if so desired.

All control for accomplishing this remarkable fabrication ability, at least insofar as internal material working characteristics are concerned, rests essentially purely in "modulated" control over the way in which a processing illumination beam (or the like) addresses each area of beam/material impingement.

While various embodiments and manners of practicing the present invention have been illustrated and described herein, variations and modification are possible without departing from the spirit of the invention.

I claim:

1. A method of forming from a precursor material having selectively and controllably changeable crystalline-structure related mechanical properties, a stacked/layered arrangement of monolithically deployed, crystal-structure-processed mechanical devices, wherein each layer is formed in a processing manner which is common to all of the layers, with each successive layer formed and stacked directly on top of a preceding underlying layer, and with the processing steps associated with each such layer comprising placing a precursor body of such material in a processing zone, and within that zone, deploying that body either directly on a supporting substrate, or on an already formed predecessor layer, selecting for each device in an intended monolithic array of devices an associated volumetric region in the associated body of material, which region is suitable (a) for the creation therefrom of the desired associated device configuration, and (b) for the establishment therein of a desired set of crystalline-structure-related mechanical properties, within the processing zone, subjecting each such selected region to a controlled changing of the crystalline structure therein, and thus of the related mechanical properties, and performing this subjecting step in a manner which avoids producing any heat damage to the immediately adjacent underlying supporting structure (substrate or predecessor layer), and by that processing, achieving, in each selected device region, the desired set of mechanical properties.

2. The method of claim 1 which further comprises similar processing of the body of material in at least one layer in the stack of layers to create therein plural distributed regions of changed internal crystalline structure each forming at least a portion of an electrical device.

* * * * *